(12) United States Patent
Kanezaki et al.

(10) Patent No.: US 9,461,059 B1
(45) Date of Patent: Oct. 4, 2016

(54) PATTERNING FOR VARIABLE DEPTH STRUCTURES

(71) Applicant: SanDisk Technologies Inc., Plano, TX (US)

(72) Inventors: Erika Kanezaki, Yokkaichi (JP); Ryo Nakamura, Yokkaichi (JP)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/667,076

(22) Filed: Mar. 24, 2015

(51) Int. Cl.
*H01L 27/115* (2006.01)
*H01L 21/8234* (2006.01)

(52) U.S. Cl.
CPC . *H01L 27/11521* (2013.01); *H01L 21/823418* (2013.01); *H01L 21/823475* (2013.01); *H01L 21/823481* (2013.01)

(58) Field of Classification Search
CPC .............................................. H01L 21/823475
See application file for complete search history.

(56) References Cited

U.S. PATENT DOCUMENTS

| | | |
|---|---|---|
| 5,604,158 A | 2/1997 | Cadien et al. |
| 6,103,623 A | 8/2000 | Lien et al. |
| 2008/0179746 A1 | 7/2008 | Hur et al. |
| 2013/0214415 A1* | 8/2013 | Pachamuthu ....... H01L 21/7682 257/751 |
| 2014/0219024 A1 | 8/2014 | Ogi et al. |
| 2014/0231896 A1* | 8/2014 | Matsumori ........... H01L 29/401 257/316 |
| 2015/0228582 A1* | 8/2015 | Sel ...................... H01L 21/7682 257/751 |
| 2015/0332953 A1* | 11/2015 | Futase ................. H01L 21/7682 438/421 |
| 2016/0035738 A1* | 2/2016 | Kakegawa ........ H01L 21/31111 257/314 |
| 2016/0086848 A1* | 3/2016 | Shishido ........... H01L 21/76892 257/773 |
| 2016/0126179 A1* | 5/2016 | Takahashi ............. H01L 23/528 257/774 |

OTHER PUBLICATIONS

"Office Action mailed Aug. 17, 2016," U.S. Appl. No. 14/734,888, filed Jun. 9, 2015, 19 pages.

* cited by examiner

*Primary Examiner* — Lex Malsawma
(74) *Attorney, Agent, or Firm* — Davis Wright Tremaine LLP

(57) ABSTRACT

A method of forming a NAND flash memory includes forming a dielectric layer over NAND strings separated by shallow trench isolation structures, forming an opening in a mask layer over the dielectric layer, the opening extending over contact areas, the opening having a first width at first locations over contact areas and having a second width at second locations over shallow trench isolation structures, the second width being less than the first width.

20 Claims, 9 Drawing Sheets

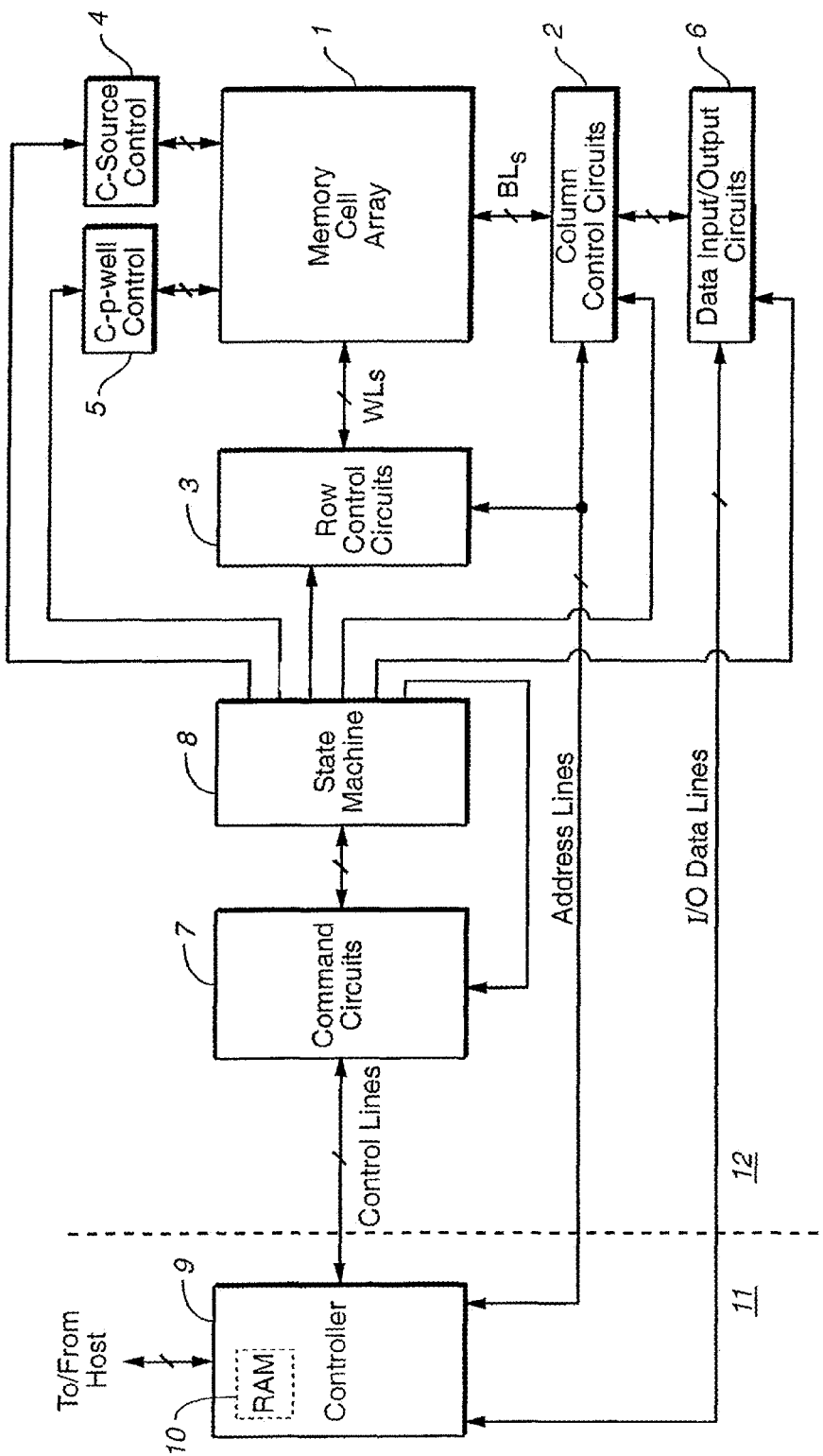
FIG._1
*(Prior Art)*

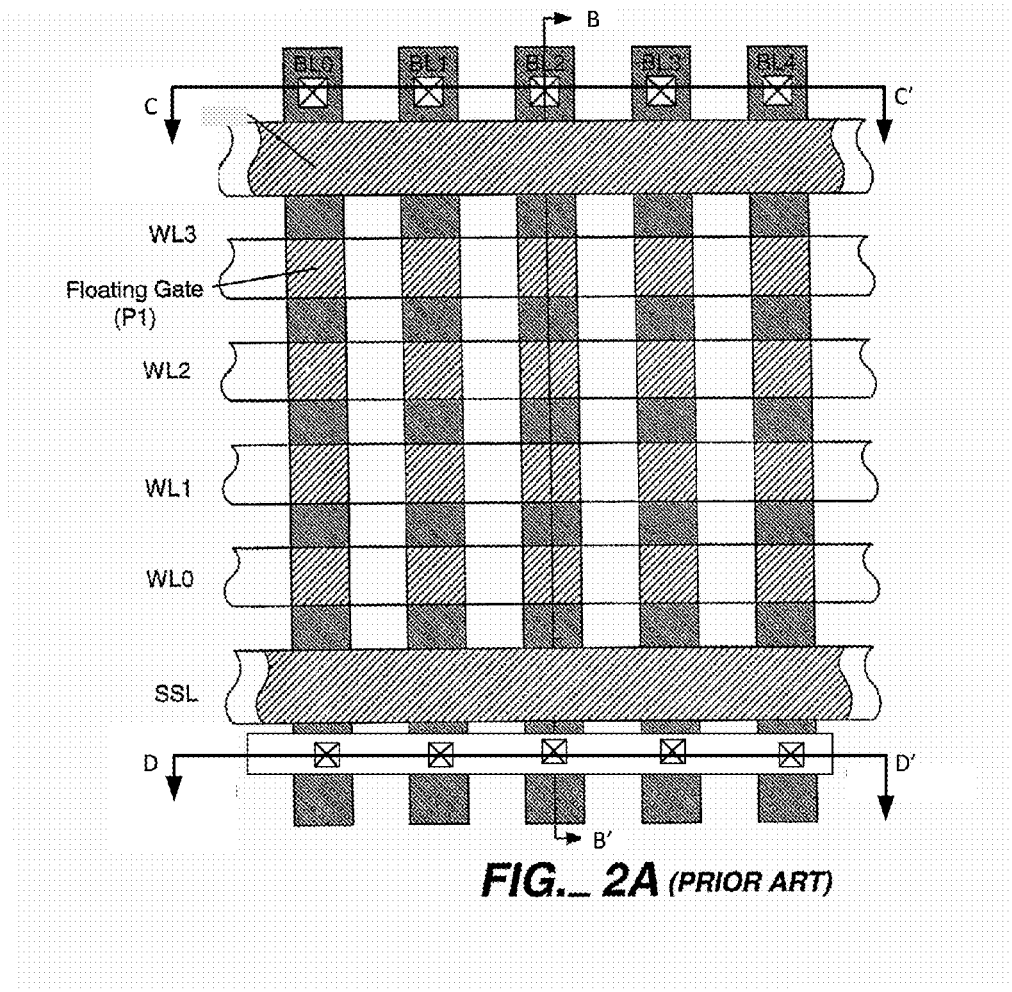
FIG._2A *(PRIOR ART)*
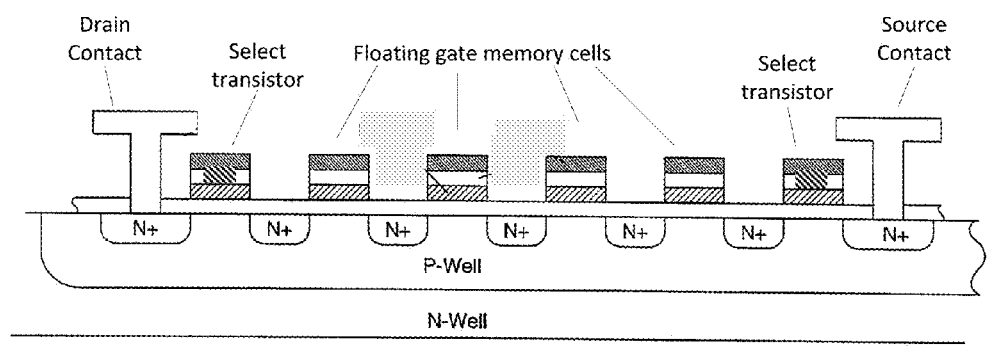
FIG._2B *(PRIOR ART)*
(Section A-A)

(Section B-B)

(Section B-B)

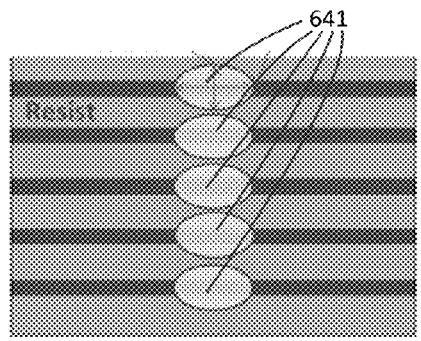
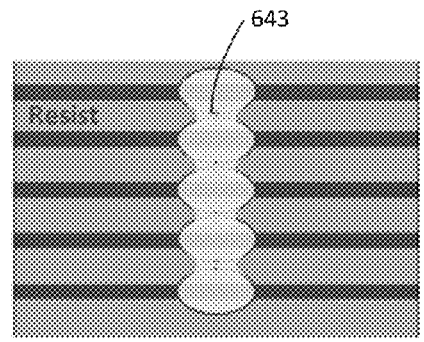
FIG. 6A              FIG. 6B
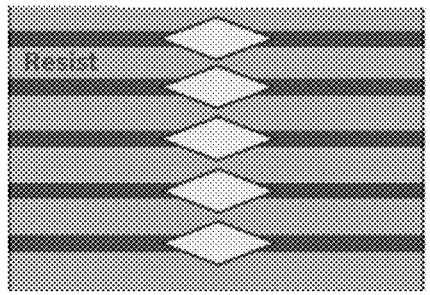
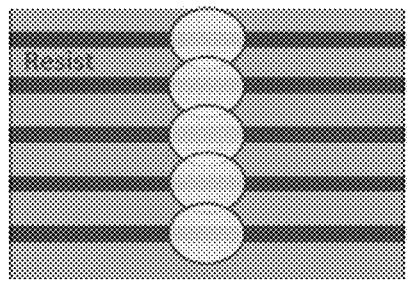
FIG. 7               FIG. 8
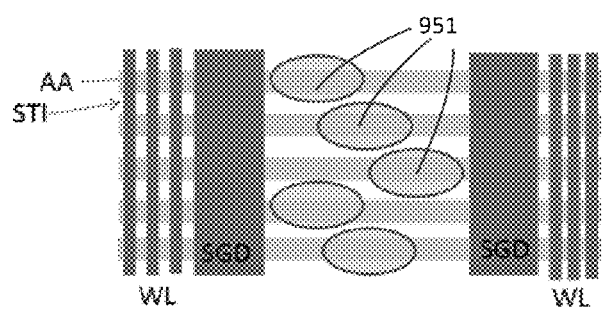
FIG. 9

PATTERNING FOR VARIABLE DEPTH STRUCTURES

BACKGROUND

This application relates generally to non-volatile semiconductor memories of the flash memory type, their formation, structure and use.

There are many commercially successful non-volatile memory products being used today, particularly in the form of small form factor cards, USB drives, embedded memory, and Solid State Drives (SSDs) which use an array of flash EEPROM cells. An example of a prior art flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

The top and bottom of a string connect to a global bit line and a common source line respectively through select transistors (source select transistor and drain select transistor). Select transistors are used to connect NAND strings to control circuits when they are to be accessed, and to isolate them when they are not being accessed. Select transistors may be larger than the transistors that form nonvolatile memory cells and select lines may be wider than word lines. In general, it is desirable to form both word lines (which are relatively narrow) and select lines (which are relatively wide) in the same layer or layers using a common pattern.

At either end of a NAND string there is a contact area formed in the silicon substrate to allow the NAND string to be electrically connected. Contact areas in FIG. 2B are N+ doped areas in the substrate formed by implantation in a P-well. A drain contact formed of metal contacts the contact area on the drain side of the NAND string and a source contact also formed of metal contacts the contact area on the source side of the NAND string. Forming such contacts presents various problems as device sizes scale to ever-smaller dimensions.

SUMMARY

In an example of NAND flash memory formation, NAND strings are formed in a substrate where they are separated by Shallow Trench Isolation (STI) structures. Contacts are formed on contact areas at either end of NAND strings. Drain contact areas may be connected together by a common source line formed in a trench that extends across and exposes the drain contact areas. By forming the trench using an opening (e.g. etch mask opening) that alternates from wide (over contact areas of NAND strings) to narrow (over STI structures) the depth of the trench alternates accordingly from deeper (over contact areas) to shallower (over STI structures). In this way, when the trench has achieved a desired depth over contact areas (e.g. reaching an etch-stop layer near the surface of the substrate) the trench may be significantly shallower over STI structures (a significant distance from the STI structures). Further etching allows contact pads to be exposed at the bottom of the trench while STI structures are still covered. Such covering provides a barrier that prevents exposure of voids to etchant and thus protects penetration of etchant and potential damage.

An example of a method of forming a NAND flash memory includes: forming an array of NAND flash memory cells across a surface of a silicon substrate, the NAND flash memory cells arranged in NAND strings, each NAND string having contact areas at ends, neighboring NAND strings separated by a shallow trench isolation structure; subsequently forming a dielectric layer over the NAND strings and the shallow trench isolation structures; subsequently forming a mask layer over the silicon substrate; and subsequently forming an opening in the mask layer, the opening being elongated along a direction that is perpendicular to the NAND strings, the opening extending over a plurality of contact areas, having a first width at first locations over contact areas and having a second width at second locations over shallow trench isolation structures, the second width being less than the first width.

Forming the opening in the mask layer may include forming a plurality of isolated individual openings that are aligned along the direction that is perpendicular to the NAND string, and subsequently expanding and merging the isolated individual openings. The plurality of isolated individual openings may be aligned over contact areas of a plurality of NAND strings. The mask layer may be used as a hard mask while performing anisotropic etching, the opening defining a trench that extends down to a first depth at the first locations and extends down to a second depth at the second locations, the second depth being less than the first depth. A liner layer may be formed along surfaces of the trench. The trench may be extended through the liner layer to expose the contact areas at the first locations without extending the trench through the liner layer at the second locations. Metal may be deposited in the trench to electrically contact the contact areas at the first locations and thereby form common connections to a plurality of NAND strings. The metal in the trench may be separated from the shallow trench isolation structures by the liner layer. The elongated opening may have opposing sides that have opposing indentations at the first locations and have opposing protrusions at the second locations.

An example of a method of forming a NAND flash memory includes: forming a plurality of NAND strings extending in a first direction, an individual NAND string having a contact area at each end; forming a plurality of shallow trench isolation structures separating the plurality of NAND strings; forming a plurality of word lines extending in a second direction that is perpendicular to the first direction; subsequently forming a dielectric layer over the plurality of NAND strings and the plurality of word lines; and subsequently forming a trench that extends along the second direction, the trench extending down through the dielectric layer over the contact areas to expose contact areas of the plurality of NAND strings, the trench extending down partially through the dielectric layer over the shallow trench isolation structures to leave a portion of the dielectric layer between the trench and a shallow trench isolation structure.

Metal may subsequently be deposited in the trench, the metal forming electrical contact with exposed contact areas of the plurality of NAND strings thereby forming a common source connection. Forming the trench may include: forming an opening in a mask layer, the opening being elongated along the first direction and having a dimension along the second direction that alternates from a first width at first locations over contact areas and a second width at second locations over shallow trench isolation structures. Forming the opening may include forming a plurality of isolated individual openings aligned along the first direction and subsequently expanding the plurality of isolated individual openings to merge the plurality of isolated individual openings. Forming the trench may further include: subsequent to forming the opening, performing anisotropic etching; subsequently depositing a liner layer on exposed surfaces; and subsequently etching through the liner layer to expose the contact areas of the plurality of NAND strings without etching through the liner layer over the shallow trench isolation structures. The method may also include: forming drain contact openings in the mask layer, the drain contact openings located over drain contact areas; and subsequently performing anisotropic etching through the opening and the drain contact openings to form the trench and to form drain contact holes that expose the drain contact areas. A metal may be deposited in the trench and in the drain contact holes, the metal in the trench forming a continuous common source line that connects source contact areas of a plurality of NAND strings and the metal in the drain contact holes forming a plurality of electrically separate drain contacts.

An example of a NAND flash memory may include: a plurality of NAND strings extending in a first direction along a substrate surface, an individual NAND string having a source contact area at a source end and a drain contact area at an opposing drain end; a plurality of shallow trench isolation structures between the plurality of NAND strings; and a common source line extending in a second direction that is perpendicular to the first direction, the common source line extending down a first depth to the substrate surface at the source contact areas, and extending down a second depth over the shallow trench isolation structures, the second depth being less than the first depth.

The common source line may have an upper surface and the width of the common source line along the upper surface may alternate between a first width over the source contact areas and a second width over the shallow trench isolation structures, the second width being less, than the first width. A liner layer of dielectric may extend along sides of the common source line, the common source line extending through the liner layer over the source contact areas, the liner layer extending between the common source line and the shallow trench isolation structures. A plurality of drain contacts may extend vertically from the drain contact areas, each of the plurality of drain contacts isolated from neighboring drain contacts.

Various aspects, advantages, features and embodiments are included in the following description of examples, which description should be taken in conjunction with the accompanying drawings.

BRIEF DESCRIPTION OF THE DRAWINGS

FIG. 1 is a block diagram of a prior art memory system.
FIG. 2A is a plan view of a prior art NAND array.

FIG. 2B shows a cross section of a NAND string of FIG. 2A.
FIGS. 6A-B illustrate an example of merging isolated openings to form an elongated opening of varying width.
FIG. 7 illustrates a pattern of rhomboid openings.
FIG. 8 illustrates a pattern of overlapping openings.
FIG. 9 illustrates isolated openings defining isolated drain contacts.

DETAILED DESCRIPTION OF EXEMPLARY EMBODIMENTS

Memory System

Figure 2C:
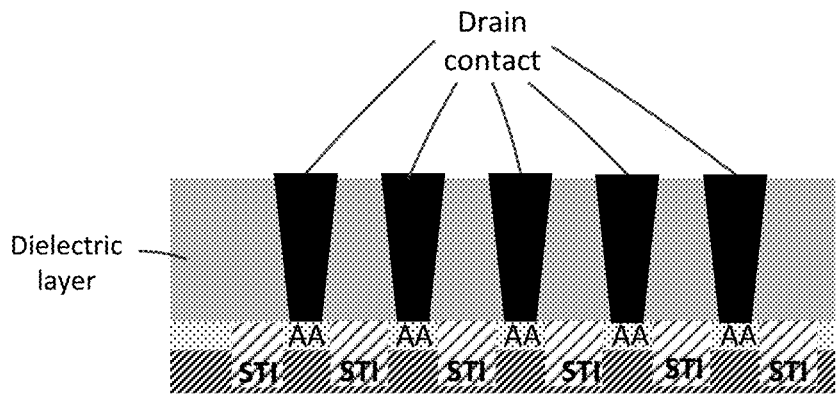
FIG. 2C is a cross section of drain contacts of FIG. 2A.
Figure 2D:
FIG. 2D is a cross section of a common source line of FIG. 2A.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

An example of a prior art memory system, which may be modified to include various structures described here, is illustrated by the block diagram of FIG. 1. A planar memory cell array 1 including a plurality of memory cells is controlled by a column control circuit 2, a row control circuit 3, a c-source control circuit 4 and a c-p-well control circuit 5. The memory cell array 1 is, in this example, of the NAND type similar to that described above in the Background. A control circuit 2 is connected to bit lines (BL) of the memory cell array 1 for reading data stored in the memory cells, for determining a state of the memory cells during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells are formed. The c-source control circuit 4 controls a common source line (labeled as "c-source" in FIG. 1) connected to the memory cells (M). The c-p-well control circuit 5 controls the c-p-well voltage.

The data stored in the memory cells are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. The memory system of FIG. 1 may also be used in a Solid State Drive (SSD) or similar unit that provides mass data storage in a tablet, laptop computer, or similar device. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

FIGS. 2A-2D show different views of a prior art NAND flash memory. In particular, FIG. 2A shows a plan view of a portion of such a memory array including bit lines (BL0-BL4) and word lines (this is a simplified structure with a small number of word lines and bit lines). FIG. 2B shows a cross section along B-B' (i.e. along a NAND string) showing individual memory cells that are connected in series with select transistors at each end of the NAND string. Source and drain contacts connect the NAND string shown as part of a larger memory array. In this example, the drain contact connects the drain side of the NAND string to a global bit line (not shown) that runs parallel to the NAND string at a higher metal level. The source contact connects the source side of the NAND string to a common source line that extends in a direction that is perpendicular to the NAND string (i.e. parallel to the word lines).

FIG. 2C shows a cross section along C-C' of FIG. 2A. Contacts extend up from active areas ("AA") in the substrate where the contacts make electrical contact with the doped active areas in what may be considered a drain contact areas of the NAND strings. Each of the drain contacts shown is electrically isolated from neighboring drain contacts by a dielectric layer. Global bit lines may be formed over and aligned with the contacts shown so that each NAND string is connected to a different global bit line. Thus, each of the NAND strings may have a different bias applied to its drain to allow selective accessing of cells of different NAND strings (e.g. selective programming of memory cells of some NAND strings while others are inhibited). NAND string, including their contact areas, are isolated from each other by STI structures that extend along the bit line direction between neighboring NAND strings.

In contrast to the individual contacts connecting drain ends of the NAND strings, a common contact is formed to the drain ends of the NAND strings. A conductive line extends along the cross section of FIG. 2D and forms an electrical connection to contact areas of NAND strings (active areas, "AA"). The conductive line also extends across STI structures between NAND strings and lies in contact with STI structures.

A common source line may be formed by etching a trench that exposes source contact areas and subsequently filling the trench with metal. Such a trench is etched to a sufficient depth to expose contact areas and may also expose STI structures. However, there may be undesirable consequences from exposing such STI structures and depositing metal on them.

Figure 3A:
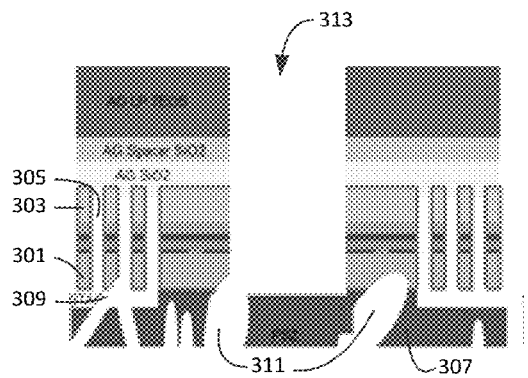
FIGS. 3A-D illustrate penetration of wet etchant through exposed STI material.

FIGS. 3A-D illustrate an example of problems related to exposure of STI structures. FIG. 3A shows a cross section of a portion of a NAND flash memory array at an intermediate stage of fabrication. FIG. 3A shows floating gates (e.g. floating gate 301) and word lines (e.g. word line 303) in cross section with air gaps (e.g. air gap 305) between neighboring word lines and floating gates. FIG. 3A also shows an STI structure 307 that is formed of polysilazane (PSZ). An air gap 309 extends over the STI structure 307, along the bit line direction, to isolate adjacent floating gates in the word line direction. Air gaps extending along the word line direction between word lines and floating gates (e.g. air gap 305) and air gaps extending along the bit line direction between floating gates (e.g. air gap 309) may not be isolated from each other so that air, or other gas or fluid, may travel between such air gaps.

STI structure 307 has voids (e.g. voids 311) formed in it and some of the voids extend to the air gaps (e.g. to air gap 309). FIG. 3A also shows a trench 313 that is etched where source contacts are to be formed. Forming a trench may expose some of the voids in the STI material between NAND strings and this may allow etchant to enter voids and expand voids (i.e. etching may extend beyond the trench because etchant progresses into STI along voids and then expands the voids by etching the PSZ).

Figure 3B:
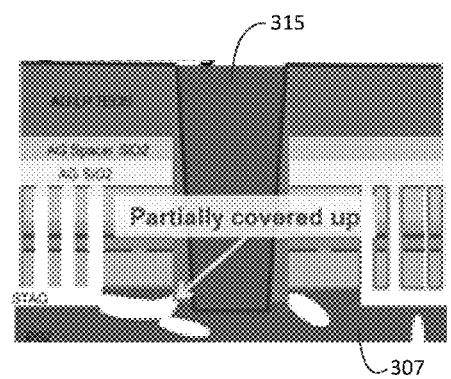

FIG. 3B shows the structure of FIG. 3A after deposition of dielectric 315 in the trench, for example by depositing layers of dielectric material and subsequently planarizing, e.g. using Chemical Mechanical Polishing (CMP), to remove excess dielectric material. Such deposition covers exposed conductive material (e.g. floating gate layer and control gate layer portions that later form select lines) and also may partially cover up voids in STI structure 307, e.g. at location marked "Partially covered up".

Figure 3C:
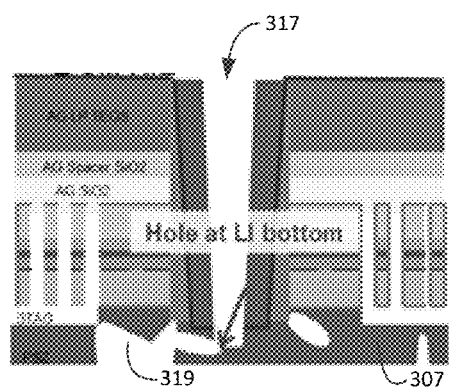

FIG. 3C shows the structure of FIG. 3B after formation of a trench 317 within dielectric 315 (e.g. by anisotropic etching such as by RIE) to expose contact areas (not shown in the cross section of FIG. 3C because the plane of FIG. 3C is along the STI, not active area). The trench extends into the STI structure 307 and exposes a void 319 at the location indicated "Hole at LI bottom."

Figure 3D:
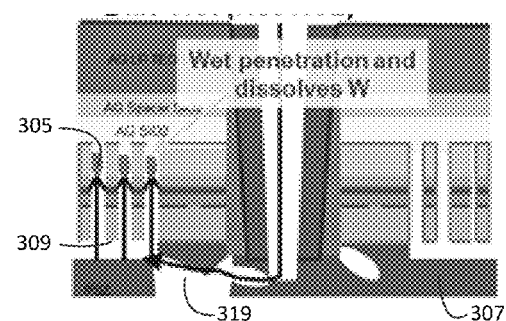

FIG. 3D illustrates how a subsequent wet etch may penetrate into STI structure 307 along voids such as void 319 and may continue into air gaps that separate floating gates and word lines (e.g. air gap 305). When wet etchant enters such air gaps it may travel extensively along connected air gaps (along pathway indicated by arrows) and may damage sensitive floating gate and word line structures. For example, tungsten (W) that is used to form word lines may be attacked and dissolved by etchant which may cause one or more word lines to be inoperable, which may in turn cause a block to be unusable. Such damage may be seen as a "black haze" that affects the appearance of a die.

In order to ensure good contact between metal of a common source line and source contact areas of NAND strings, some over-etching may be performed to ensure that there is no material between the contact and the contact area. Such over-etching may tend to produce a trench extending into STI structures as shown so that exposure of voids is likely to occur at some locations. Wet etching to clean etched surfaces may cause penetration through such exposed voids and may result in damage as illustrated.

Figure 4:
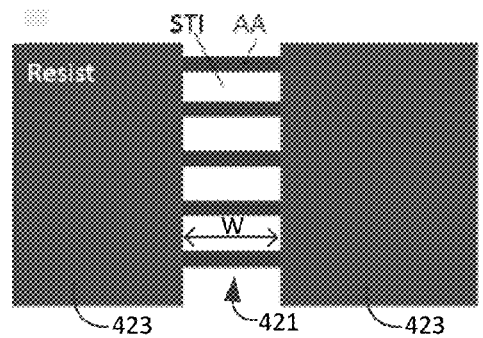
FIG. 4 shows an example of an opening used to define a trench for source line formation.

FIG. 4 shows a top-down view of a substrate with an opening 421 to form a trench as shown in FIG. 3C, i.e. an elongated opening that is formed in a resist layer 423 to define a trench when anisotropic etching is performed. The elongated opening 421 has a uniform width (W) and extends over and exposes both active areas ("AA") and STI structures ("STI") in the substrate.

Figure 5A:
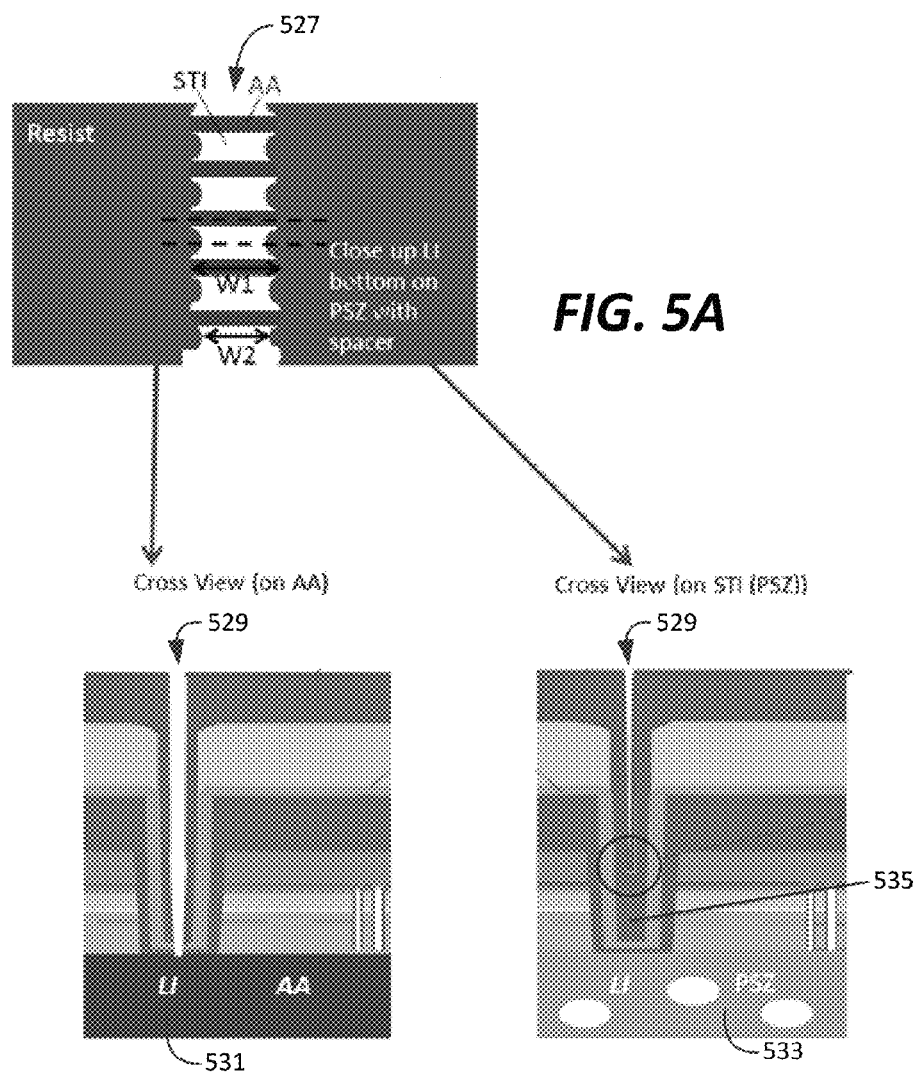
FIGS. 5A-C illustrate an example of an opening that alternates between wide and narrow, and the profiles formed by anisotropic etching through the opening.

In contrast, FIG. 5A shows a top-down view of a different opening 527 that is used to form a trench with variable depth. It can be seen that the width of the opening varies from a first width ("W1") over active areas to a smaller second width ("W2") over STI structures. Thus, the opposing sides of the opening can be seen to have a zig-zag profile with alternating protrusions (over STI structures) and indentations (over active areas). When such an opening is used to define a trench during anisotropic etching, the alternating widths produce different trench profiles at different locations.

Figure 5B:
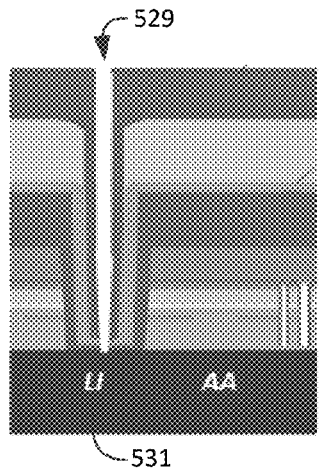
Figure 5C:
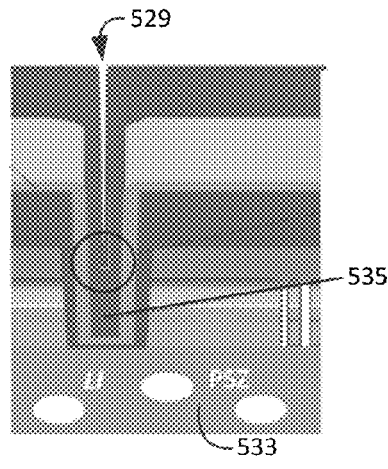

The results of alternating the widths of the opening between wider and narrower dimensions may be seen at two locations in FIGS. 5B and 5C which show cross sections at a contact area of a NAND string (FIG. 5B) and along an STI structure between NAND strings (FIG. 5C).

FIG. 5B shows trench 529 at a point where the opening is wider over a contact area. Trench 529 extends down to the substrate 531 to expose the active area (AA) and thus allow a common source line that is subsequently formed in the trench to contact the NAND string. Some over-etching may be performed so that the trench extends deeper than the upper surface of the substrate 531 at this location. Wet etching may be performed after anisotropic dry etching.

In contrast, FIG. 5C shows trench 529 at a point where the narrower opening over an STI structure 533 results in shallower etching. In general, a wider opening provides higher etch rate and deeper etching during anisotropic etching than a narrower opening does, according to what may be referred to as "microloading effect." The depth of trench 529 at the location of FIG. 5C is significantly less than shown in FIG. 5B so that trench 529 does not extend to the level of the upper surface of substrate 531 at this location. Instead, significant dielectric material 535 remains between the trench and the underlying STI structure so that there is no pathway for etchant to enter voids in STI structure 533, and thus no pathway for etchant to penetrate into air gaps and attack word lines or floating gates.

It will be understood that the two cross sections of FIGS. 5B and 5C are representative of the trench profile at contact areas and STI structures respectively so that the trench alternates from being wider and therefore deeper over contact areas to being narrower and therefore shallower over STI structures. This ensures that good contact is made with contact areas in the substrate without exposing STI structures to etching at this stage.

An opening that varies between wide and narrow dimensions may be formed in any suitable manner. FIGS. 6A-B illustrate one way that such an opening may be formed. Initially, a row of isolated openings 641 are defined, for example, using a photo mask (reticle) that has a pattern as shown in FIG. 6A and then isolated openings are merged into a single opening 643 (e.g. by wet etching). Alternatively, exposure may be extended to over dose the exposed resist and cause the exposed areas to merge so that a single elongated opening is formed.

The shape of individual openings defined by a photo mask may be oval-shaped as shown in FIG. 6A or may be any other suitable shape. FIG. 7 shows an example where the individual openings are diamond-shaped (rhombus) in top-down view. Subsequent processing may expand individual openings to form an elongated opening that alternates between wide and narrow dimensions.

FIG. 8 shows an example in which an extended opening is defined by a pattern of partially overlapping circular openings. No overexposure may be required in this example because the overlapping pattern in the photo mask results in a single elongated opening without requiring over dosing.

It may be efficient to form an opening that defines a common source line in the same patterning step that forms other openings, such as openings that define electrically-separate drain contacts as shown in FIG. 2C. FIG. 9 shows an example of a pattern of openings that define drain contacts over contact areas at the drain ends of NAND strings that are separated by STI structures ("STI"). In order to avoid merging of openings 951, these openings are offset, or staggered, along the bit line direction so that they remain isolated (i.e. no merging of openings 951 occurs because they are staggered). While, openings are aligned in a straight line at the source end of such NAND strings and merge into a single opening, openings are staggered at the drain end of the NAND strings to ensure that they remain isolated and do not merge. Individual openings may be the same at either end, e.g. having the same shape and dimensions (or may be different). In this way, the same patterning step may be used to define a trench of alternating width at the source end and to define isolated holes at the drain end. When filled with metal, these form a common source line and separate, electrically isolated, drain contacts respectively. While the pattern of FIG. 9 shows a pattern that repeats every three contacts (a "triple stepped" pattern), other patterns may also be used (e.g. every other contact may be stepped, or pattern may repeat every four, five, or more contacts).

Figure 10A:
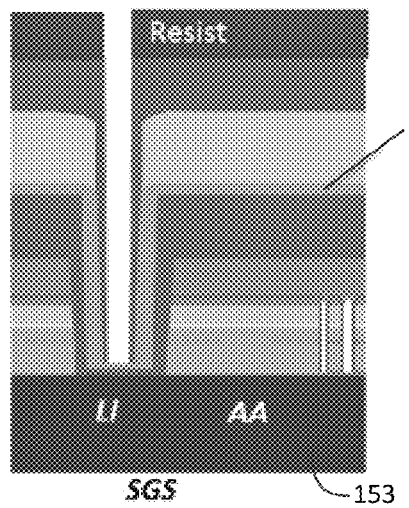
FIGS. 10A-B illustrate a NAND flash memory at an intermediate stage of fabrication.
Figure 10B:
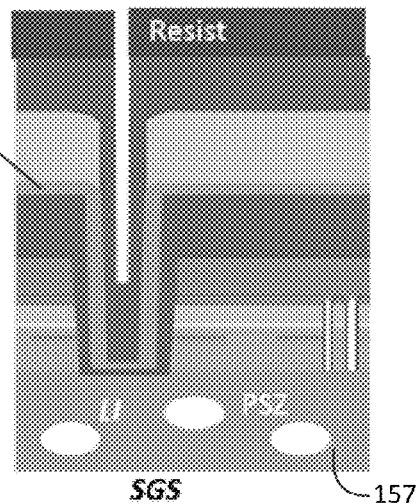

FIGS. 10A-B show cross sections of a trench at an intermediate stage of fabrication of a NAND flash memory. Specifically, FIG. 10A shows a cross section at a source contact area (active area, AA) where the trench is wider and where etching extends down close to the substrate 153. In this example, an etch stop layer 155, for example a layer of silicon nitride (SiN), is used so that anisotropic etching stops at this point, before exposing the active area. FIG. 1013 shows a cross section of the trench over an STI structure 157. At this location the trench is narrower so that anisotropic etching has not reached the etch stop layer 155.

Figure 11A:
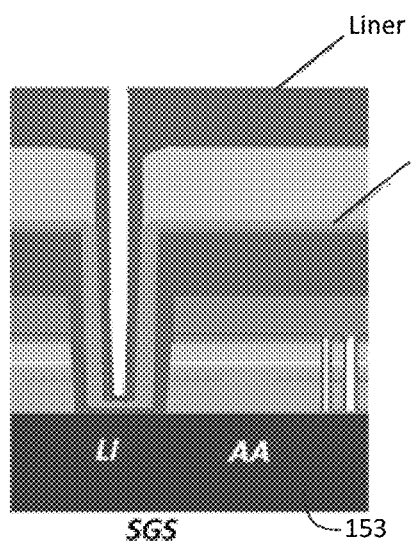
FIGS. 11A-B illustrate the NAND flash memory of FIGS. 10A-B after deposition of a liner layer.
Figure 11B:
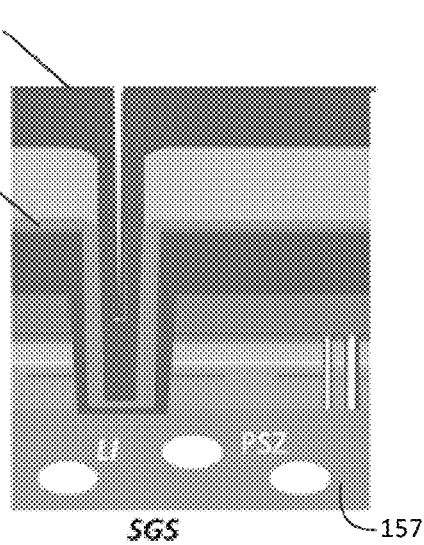

FIGS. 11A-B show the trench of FIGS. 10A-B at the same locations at a subsequent stage of fabrication. At this stage a liner layer 159, for example a layer of silicon oxide, is deposited. The liner layer extends along surfaces of the trench. At the wider trench location of FIG. 11A the liner layer deposits along side surfaces and the bottom surface of the trench. At the narrower trench location of FIG. 11B, the trench is sufficiently narrow towards the bottom that liner layer deposited on sidewalls fills the lower part of the trench at this point, i.e. the trench may be filled where the width of the trench is less than twice the thickness of the liner layer so that the vertical thickness of the liner layer material at this location may be significantly greater than the thickness of the liner layer.

Figures 12A, 12B:
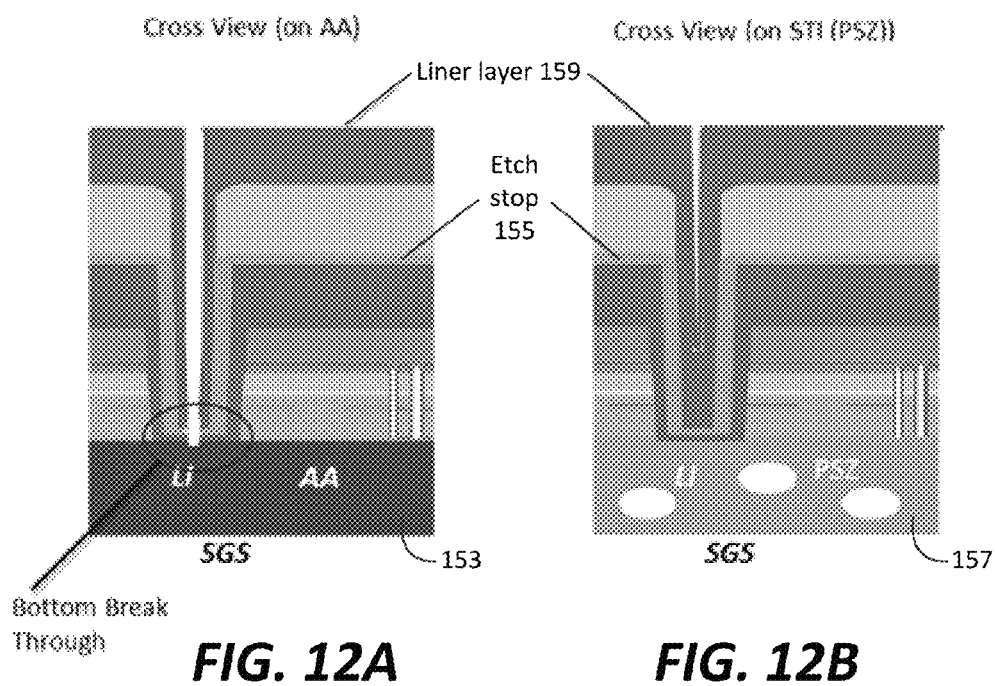
FIGS. 12A-B illustrate the NAND flash memory of FIGS. 12A-B after etching through the liner layer over contact areas.

FIGS. 12A-B show the trench of FIGS. 11A-B at the same locations at a subsequent stage of fabrication. An additional anisotropic etch step is used to break through the liner layer at the bottom of the trench at the wider location of FIG. 12A ("Bottom break through"). Etching then extends the trench at this location until the contact area is exposed. In contrast, no such break through occurs at the narrower location of FIG. 12B because of microloading and the greater vertical height of liner layer at this location (in addition to greater amount of other dielectric material under the liner layer). Wet etching can safely be performed at this stage without exposing any STI voids to wet etch. Voids in the STI structure 157 are isolated from exposure to wet etch by the dielectric that remains over the PSZ including the etch stop layer 155, liner layer 159 and any other overlying dielectrics.

Figure 13:
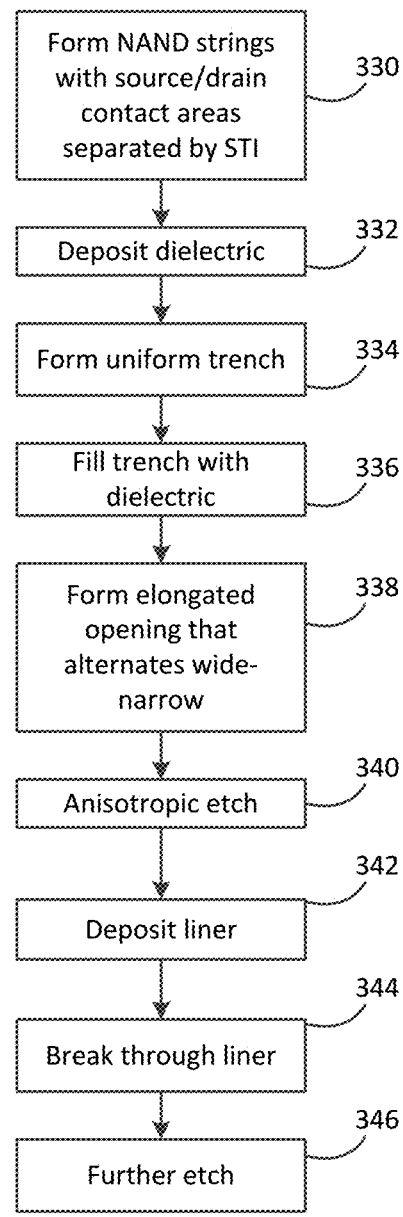
FIG. 13 shows an example of process steps used to form a NAND flash memory.

FIG. 13 shows an example of steps that may be used to form contacts in a NAND flash memory. NAND strings with source and drain contact areas, separated by STI structures, are formed 330 in a substrate using any suitable process. Subsequently, one or more dielectrics are deposited 332 to form a dielectric layer over the NAND strings. Anisotropic etching is then used to form a uniform trench 334, in this case, a trench of uniform width that extends perpendicular to the NAND strings. The trench is then filled 336 with dielectric (e.g. by depositing one or more dielectric materials that may include an etch-stop layer). Subsequently, patterning is used to form elongated openings 338 that alternate from wide to narrow, for example, in a resist layer and etch mask layer. Anisotropic etching 340 is then performed using the opening to define a trench. Etching tends to extend deeper where the trench is wider. Etching may stop at an appropriate point, for example, using an etch-stop layer to stop before the contact areas are exposed. Subsequently, a liner layer is formed 342 in the trench. A subsequent etch step is used to break through the liner 344 at locations where the trench is wider while the liner remains at locations where the trench is narrower. Further etching 346 may then extend the trench where the break through occurred, over the contact areas, without significantly affecting areas where no breakthrough occurred, e.g. by using selective etching. Wet etching may be used at this point without significant risk of etchant penetrating through STI material.

CONCLUSION

Although the various aspects have been described with respect to examples, it will be understood that protection within the full scope of the appended claims is appropriate.

It is claimed:

1. A method of forming a NAND flash memory comprising:
    forming an array of NAND flash memory cells across a surface of a silicon substrate, the NAND flash memory cells arranged in NAND strings, each NAND string having contact areas at ends, neighboring NAND strings separated by a shallow trench isolation structure;
    subsequently forming a dielectric layer over the NAND strings and the shallow trench isolation structures;
    subsequently forming a mask layer over the silicon substrate; and
    subsequently forming an opening in the mask layer, the opening being elongated along a direction that is perpendicular to the NAND strings, the opening extending over a plurality of contact areas, having a first width at first locations over contact areas and having a second width at second locations over shallow trench isolation structures, the second width being less than the first width.

2. The method of claim 1 wherein forming the opening in the mask layer comprises forming a plurality of isolated individual openings that are aligned along the direction that is perpendicular to the NAND string, and subsequently expanding and merging the isolated individual openings.

3. The method of claim 2 wherein the plurality of isolated individual openings are aligned over contact areas of a plurality of NAND strings.

4. The method of claim 1 further comprising: using the mask layer as a hard mask while performing anisotropic etching, the opening defining a trench that extends down to a first depth at the first locations and extends down to a second depth at the second locations, the second depth being less than the first depth.

5. The method of claim 4 further comprising: forming a liner layer along surfaces of the trench.

6. The method of claim 5 further comprising: subsequently extending the trench through the liner layer to expose the contact areas at the first locations without extending the trench through the liner layer at the second locations.

7. The method of claim 6 further comprising: depositing metal in the trench to electrically contact the contact areas at the first locations and thereby form common connections to a plurality of NAND strings.

8. The method of claim 7 wherein the metal in the trench is separated from the shallow trench isolation structures by the liner layer.

9. The method of claim 1 wherein the elongated opening has opposing sides that have opposing indentations at the first locations and have opposing protrusions at the second locations.

10. A method of forming a NAND flash memory comprising:
    forming a plurality of NAND strings extending in a first direction, an individual NAND string having a contact area at each end;
    forming a plurality of shallow trench isolation structures separating the plurality of NAND strings;
    forming a plurality of word lines extending in a second direction that is perpendicular to the first direction;
    subsequently forming a dielectric layer over the plurality of NAND strings and the plurality of word lines; and
    subsequently forming a trench that extends along the second direction, the trench extending down through the dielectric layer over the contact areas to expose contact areas of the plurality of NAND strings, the trench extending down partially through the dielectric layer over the shallow trench isolation structures to leave a portion of the dielectric layer between the trench and a shallow trench isolation structure.

11. The method of claim 10 further comprising: subsequently depositing metal in the trench, the metal forming electrical contact with exposed contact areas of the plurality of NAND strings and thereby forming a common source connection.

12. The method of claim 10 wherein forming the trench comprises: forming an opening in a mask layer, the opening being elongated along the first direction and having a dimension along the second direction that alternates from a first width at first locations over contact areas and a second width at second locations over shallow trench isolation structures.

13. The method of claim 12 wherein forming the opening comprises: forming a plurality of isolated individual openings aligned along the first direction and subsequently expanding the plurality of isolated individual openings to merge the plurality of isolated individual openings.

14. The method of claim 13 wherein forming the trench further comprises:

subsequent to forming the opening, performing anisotropic etching;
subsequently depositing a liner layer on exposed surfaces; and
subsequently etching through the liner layer to expose the contact areas of the plurality of NAND strings without etching through the liner layer over the shallow trench isolation structures.

15. The method of claim 12 further comprising:
forming drain contact openings in the mask layer, the drain contact openings located over drain contact areas; and
subsequently performing anisotropic etching through the opening and the drain contact openings to form the trench and to form drain contact holes that expose the drain contact areas.

16. The method of claim 15 further comprising: subsequently depositing a metal in the trench and in the drain contact holes, the metal in the trench forming a continuous common source line that connects source contact areas of a plurality of NAND strings and the metal in the drain contact holes forming a plurality of electrically separate drain contacts.

17. A NAND flash memory comprising:
a plurality of NAND strings extending in a first direction along a substrate surface, an individual NAND string having a source contact area at a source end and a drain contact area at an opposing drain end;
a plurality of shallow trench isolation structures between the plurality of NAND strings; and
a common source line extending in a second direction that is perpendicular to the first direction, the common source line extending down a first depth to the substrate surface at the source contact areas, and extending down a second depth over the shallow trench isolation structures, the second depth being less than the first depth.

18. The NAND flash memory of claim 17 wherein the common source line has an upper surface and the width of the common source line along the upper surface alternates between a first width over the source contact areas and a second width over the shallow trench isolation structures, the second width being less than the first width.

19. The NAND flash memory of claim 17 further comprising a liner layer of dielectric that extends along sides of the common source line, the common source line extending through the liner layer over the source contact areas, the liner layer extending between the common source line and the shallow trench isolation structures.

20. The NAND flash memory of claim 17 further comprising a plurality of drain contacts extending vertically from the drain contact areas, each of the plurality of drain contacts isolated from neighboring drain contacts.

* * * * *